(12) United States Patent
Cai

(10) Patent No.: US 8,742,345 B1
(45) Date of Patent: Jun. 3, 2014

(54) METHOD FOR DETECTING ELECTRON BEAM OF SCANNING ELECTRON MICROSCOPE AND FOR DETECTING FINE PATTERNS

(71) Applicant: Semiconductor Manufacturing International (Shanghai) Corporation, Shanghai (CN)

(72) Inventor: Boxiu Cai, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 14/028,917

(22) Filed: Sep. 17, 2013

(30) Foreign Application Priority Data

Nov. 13, 2012 (CN) .......................... 2012 1 0455060

(51) Int. Cl.
*H01J 37/28* (2006.01)
*G01N 23/00* (2006.01)

(52) U.S. Cl.
USPC ........ 250/310; 250/307; 250/311; 250/492.1; 250/492.2; 250/492.3

(58) Field of Classification Search
USPC .............. 250/252.1, 255, 306, 307, 310, 311, 250/390.06, 396 R, 397, 526, 558.04, 250/559.06
See application file for complete search history.

(56) References Cited

U.S. PATENT DOCUMENTS

| | | | | |
|---|---|---|---|---|
| 6,075,902 A | * | 6/2000 | Kojima .......................... | 382/260 |
| 8,134,411 B2 | * | 3/2012 | Shi et al. ........................ | 331/1 A |
| 2006/0251994 A1 | * | 11/2006 | Huang et al. .................. | 430/311 |
| 2009/0039261 A1 | * | 2/2009 | Toyoda et al. ................ | 250/310 |
| 2009/0262877 A1 | * | 10/2009 | Shi et al. ........................ | 375/376 |
| 2012/0274757 A1 | * | 11/2012 | Bai et al. ........................ | 348/79 |

FOREIGN PATENT DOCUMENTS

CN            1411047 A         4/2003

* cited by examiner

*Primary Examiner* — Bernard E Souw
(74) *Attorney, Agent, or Firm* — Anova Law Group, PLLC

(57) ABSTRACT

Methods for detecting an electron beam of a SEM and for detecting fine patterns are provided. Line patterns having a length in a first direction can be formed on a detection sample. A power spectral density (PSD) curve of a standardized model, formed under a same exposure process of the detection sample, can be obtained. An edge contour of each line pattern of the detection sample can be obtained by the SEM and can be sampled at a sampling frequency to obtain a variation range at a sampling point on the edge contour in a second direction that is perpendicular to the first direction. A PSD curve of the detection sample can be obtained according to the variation range and can be compared with the PSD curve of the standardized model to determine whether an electron beam of the SEM has a high quality in the second direction.

16 Claims, 6 Drawing Sheets

US 8,742,345 B1

METHOD FOR DETECTING ELECTRON BEAM OF SCANNING ELECTRON MICROSCOPE AND FOR DETECTING FINE PATTERNS

CROSS-REFERENCES TO RELATED APPLICATIONS

This application claims priority to Chinese Patent Application No. CN201210455060.3, filed on Nov. 13, 2012, the entire contents of which are incorporated herein by reference.

FIELD OF THE DISCLOSURE

The present disclosure relates to the field of semiconductor manufacturing technologies and, more particularly, relates to methods for detecting an electron beam of a scanning electron microscope (SEM) and for detecting fine patterns.

BACKGROUND

In semiconductor fabrication processes, an electron beam (e-beam) emitted by a scanning electron microscope (SEM) is often used to measure dimensions of fine patterns. However, after a long time of use or due to environmental effects and/or wearing of SEM components, the quality of electron beam from the SEM may be changed. The quality of electron beam often refers to the quality of: cross-sectional shape and radius, resolution in all directions, etc. of the electron beam, which directly affect measuring accuracy. Therefore, the quality of the electron beam often needs to be examined before use of the SEM to measure fine patterns. Such examination ensures sufficient quality of the electron beam for measuring dimensions of the fine patterns.

Conventionally, prior to measuring dimensions of fine patterns, quality of electron beam can be examined as shown in FIGS. 1-3. Referring to FIG. 1, a first reference sample 10 and a second reference sample 20 are provided. The first reference sample 10 and the second reference sample 20 are usually provided by the manufacturer. The first reference sample 10 includes a first line pattern 11 in a Y-direction. The second reference sample 20 includes a second line pattern 21 in an X-direction, perpendicular to the Y-direction.

FIG. 2 depicts a first calibration pattern 11a and a second calibration pattern 21a. The first calibration pattern 11a is in a first coordinate system. The x-axis of the first coordinate system is $X_1$ and the y-axis is $Y_1$. The first calibration pattern 11a is a contour of the first line pattern 11 (shown in FIG. 1) scanned by the SEM prior to leaving the factory for end use. The second calibration pattern 21a is in a second coordinate system. The x-axis of the second coordinate system is $X_2$ and the y-axis is $Y_2$. The second calibration pattern 21a is a contour of the second line pattern 21 shown in FIG. 1) scanned by the SEM prior to leaving the factory for end use.

Referring to FIG. 3, the first line pattern 11 on the first reference sample 10 and the second line pattern 21 on the second reference sample 20 are scanned by a current electron beam of the SEM to obtain the contour 11a' of the first line pattern 11 and the contour 21a' of the second line pattern 21.

Still referring to FIG. 3, the contour 11a' of the first line pattern 11 is compared with the first calibration pattern 11a in FIG. 2, and the contour 21a' of the second line pattern 21 is compared with the second calibration pattern 21a in FIG. 2. When the contour 11a' of the first line pattern 11 and the contour 21a' of the second line pattern 21 are respectively close to or the same as the first calibration pattern 11a and the second calibration pattern 21a, the quality of the electron beam is considered high and can be used for subsequently measuring the dimensions of fine patterns.

However, as process nodes shrink, it is desired to increase measuring accuracy of fine patterns of semiconductor devices.

BRIEF SUMMARY OF THE DISCLOSURE

According to various embodiments, there is provided a method for detecting an electron beam of a SEM. In this method, a detection sample can include a plurality of line patterns formed thereon. The plurality of line patterns can have a length in a first direction. A power spectral density (PSD) curve of a standardized model formed under a same exposure process of the detection sample can then be obtained. An edge contour of each of the plurality of line patterns of the detection sample can be obtained by the SEM. The edge contour of each of the plurality of line patterns of the detection sample can be sampled at a sampling frequency to obtain a variation range at a sampling point on the edge contour in a second direction. The second direction can be perpendicular to the first direction. A PSD curve of the detection sample can be obtained according to the variation range and can be compared with the PSD curve of the standardized model to determine whether an electron beam of the SEM has a high quality in the second direction.

According to various embodiments, there is also provided a method for detecting a fine pattern. In this method, a detection sample can include a plurality of line patterns formed thereon. The plurality of line patterns can have a length in a first direction. A power spectral density (PSD) curve of a standardized model formed under a same exposure process of the detection sample can then be obtained. An edge contour of each of the plurality of line patterns of the detection sample can be obtained by the SEM. The edge contour of each of the plurality of line patterns of the detection sample can be sampled at a sampling frequency to obtain a variation range at a sampling point on the edge contour in a second direction. The second direction can be perpendicular to the first direction. A PSD curve of the detection sample can be obtained according to the variation range and can be compared with the PSD curve of the standardized model to determine whether an electron beam of the SEM has a high quality in the second direction. A sample having a plurality of fine patterns can then be detected using the electron beam that is determined having the high quality in the second direction.

Other aspects or embodiments of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
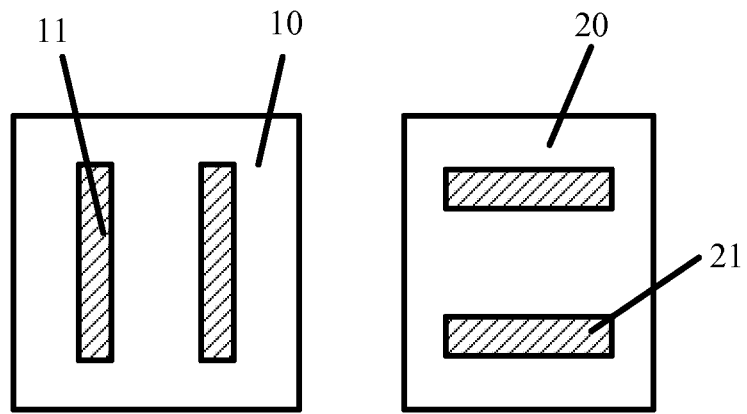
FIGS. 1-3 depict a conventional method of examining an electron beam of a SEM.

Various embodiments provide methods for detecting an electron beam of a SEM and for detecting fine patterns with improved detecting/measuring accuracy by SEM. In conventional methods, after the electron beam is used for sufficient times and is affected by oxygen, moisture, dust, etc. from the environment, the first line pattern 11 in FIGS. 1-3 on the first reference sample 10 and the second line pattern 21 on the second reference sample 20 can be changed and are no longer within the standards for measuring dimensions. When these first line pattern 11 and the second line pattern 21 are scanned, even if the contour 11a' of the first line pattern 11 overlaps with the first calibration pattern 11a, and the contour 21a' of the second line pattern 21 overlaps with the second calibration pattern 21a, the quality of the electron beam of the SEM is still not optimal and the quality of the electron beam is not satisfied.

If the electron beam with unsatisfied high quality is used for detecting/measuring fine patterns, the acquired contours of the fine patterns may deviate from the actual contours of the fine patterns. Therefore, the accuracy of the detected dimensions of fine patterns needs to be improved.

In addition, in conventional methods, as affected by noises from the SEM environment, precision of each component, quality of electron beam, etc., great differences may occur between the first calibration pattern 11a and the contour of the first line pattern 11, and between the second calibration pattern 21a and the contour of the second line pattern 21. Since the first calibration pattern 11a and the second calibration pattern 21a are subsequently used as reference standards, accordingly, the obtained results may be inaccurate.

It is thus desired to improve accuracy of the detected dimensions of fine patterns. For example, it is desirable to find a standard sample that does not change with the external environment, keeps the line patterns thereon unchanged, and accurately obtains calibration pattern of the standard sample. However, it is difficult to find such standard sample. It also remains a question how to accurately obtain the calibration pattern of such standard sample.

Due to limitations of photolithographic processes, when a line pattern is formed on a sample surface, the line pattern may inevitably have a rough surface. When used for forming a semiconductor device, the rough surface can usually affect subsequent processes and thus affect performance of semiconductor devices. Additional processes are often needed to remove the rough surface.

On the other hand, the rough surface may be useful. Under same exposure conditions, when the line patterns are formed on surfaces of a plurality of test samples, the rough surface or the roughness of the surface formed on each line pattern may be distributed the same as or similar to each other. Accordingly, the roughness distributions of a plurality of the line patterns can be summarized and a contour of the line pattern of a standardized model (also referred to as a Golden sample) can be obtained by simulation. The roughness distribution of the simulated contour can be close to or the same as the roughness distribution of the line patterns of the test samples. The effects of noises of the SEM (e.g., the electron beam of SEM) can be eliminated.

The quality of the electron beam can be subsequently detected simply by scanning a detection sample having the above described line pattern (e.g., under the same exposure condition as for that of the test samples) and by comparing the contour of the line pattern of the detection sample with the contour of the line pattern of the standardized model obtained from the simulation. When the contour of the line pattern of the detection sample substantially overlaps, or is close to, or otherwise matches with, the contour of the line pattern of the standardized model obtained from the simulation, the electron beam is considered having a high quality and can be used for detecting dimensions of fine patterns, and the dimensions obtained can be accurate.

Accordingly, a method for detecting an electron beam of a SEM is disclosed. Reference will now be made in detail to exemplary embodiments of the disclosure, which are illustrated in the accompanying drawings.

Figure 4:
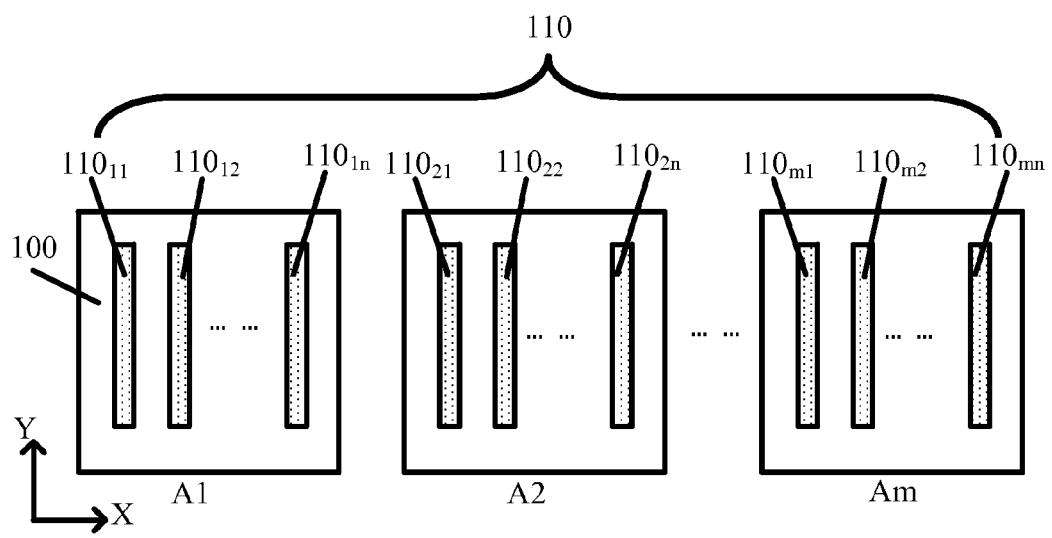
FIGS. 4-11 depict an exemplary method of detecting an electron beam of a SEM and for detecting fine patterns by the SEM in accordance with various disclosed embodiments.

Referring to FIG. 4, a plurality of test samples A1, A2, ... , and Am are provided. Each test sample has a number n of line patterns 110 formed on the surface of the test sample having a length in a first direction (e.g., in Y-direction). The exposure conditions are the same as for forming the line patterns 110 on the surface of each test sample. For example, the test sample A1 can have a plurality of line patterns $110_{11}, 110_{12}, \ldots,$ and $110_n$. The test sample A2 can have a plurality of line patterns $110_{21}, 110_{22}, \ldots,$ and $110_{2n}$. The test sample Am can have a plurality of line patterns $110_{m1}, 110_{m2}, \ldots,$ and $110_{mn}$. The test samples A1, A2, ..., and Am have a total of (m×n) line patterns 110 in the first direction.

As shown in FIG. 4, each test sample can include: a substrate 100 and line patterns 110 on surface of the substrate 100 in the first direction (e.g., in Y-direction). The material of the line patterns 110 can be, e.g., a photoresist. The method of forming the line patterns 110 can include an exposure process, a development process, and/or other suitable processes for forming the line patterns 110 of a photoresist layer on the surface of the substrate 100.

The number m of test samples A1, A2, ..., and Am can be controlled in order for the roughness distribution of the standardized model (Golden sample) subsequently obtained by the SEM to be closer to that of the test samples A1, A2 ..., and Am. Generally, a high number of test samples A1, A2, ..., and Am is desired. In one embodiment, the number m of the test samples A1, A2, ..., and Am can be about 50 or greater. In order to further improve accuracy of the subsequently simulated roughness distribution of the standardized model, and to sufficiently eliminate the effect of errors in photolithography, the number of the line patterns 110 formed in the first direction on each test sample can be greater than 1, for example about 3 to about 8.

In one embodiment, the first direction is Y-direction, the number m of test samples can be about 100, and the number n of line patterns 110 on a test sample can be about 4. In this case, the total number of line patterns 110 on test samples A1, A2 ..., and A100 can be about 400. Due to the large number of the line patterns 110, when roughness distribution of the standardized model is subsequently simulated, the effect of the noise from the SEM and the photolithographic errors is reduced to a low level or is eliminated. As such, the roughness distribution of the standardized model obtained by scanning is closer to the roughness distribution of the test samples.

As disclosed, the exposure condition can include, e.g., composition, thickness, type, and/or other conditions of the photoresist layer; power of light source used in the exposure of the photoresist layer; shape of the mask pattern; exposure time etc. The exposure condition being the same means that, for example, composition, thickness, type, and/or other conditions of the photoresist layer; power of light source used in the exposure of the photoresist layer; shape of the mask pattern; exposure time etc. are the same for forming line patterns on test samples and on samples of standardized model. In one embodiment, a ring-shaped light source can be used for the exposure process. For high quality of the line patterns 110 formed by the exposure, the exposure condition can have an exposure energy, e.g., about 25 mJ to about 50 mJ.

Due to the limitations of photolithographic processes, the edge of line patterns 110 may not be completely smooth, and the edge of the line patterns 110 can have a roughness. Although the presence of roughness in the process of forming a semiconductor device can affect performance of the semiconductor device, such roughness can be utilized to detect quality of the electron beam of a SEM.

For example, the edge contour of the line patterns 110 can be obtained by the SEM. The edge contour of each line pattern can then be sampled at a sampling frequency (e.g., characterized by the number of points sampled per unit length). The roughness distribution of the edge of the line patterns at the sampling points can be obtained.

Before the SEM scans the test samples A1, A2, . . . , and Am (shown in FIG. 4), various components of the SEM have been installed and adjusted to the optimum. Then, the line patterns 110 on the test samples A1, A2, . . . , and Am can be scanned by the SEM to obtain the contours of the line patterns 110, and the contour for each line pattern 110 can be sampled at a fixed sampling frequency.

It should be noted that, the line patterns $110_{m1}$, $110_{m2}$, . . . , and $110_{mn}$, are used herein for illustration purposes, other forms, numbers, and arrangements of line patterns can be used without limitation in accordance with various disclosed embodiments.

Figure 5:
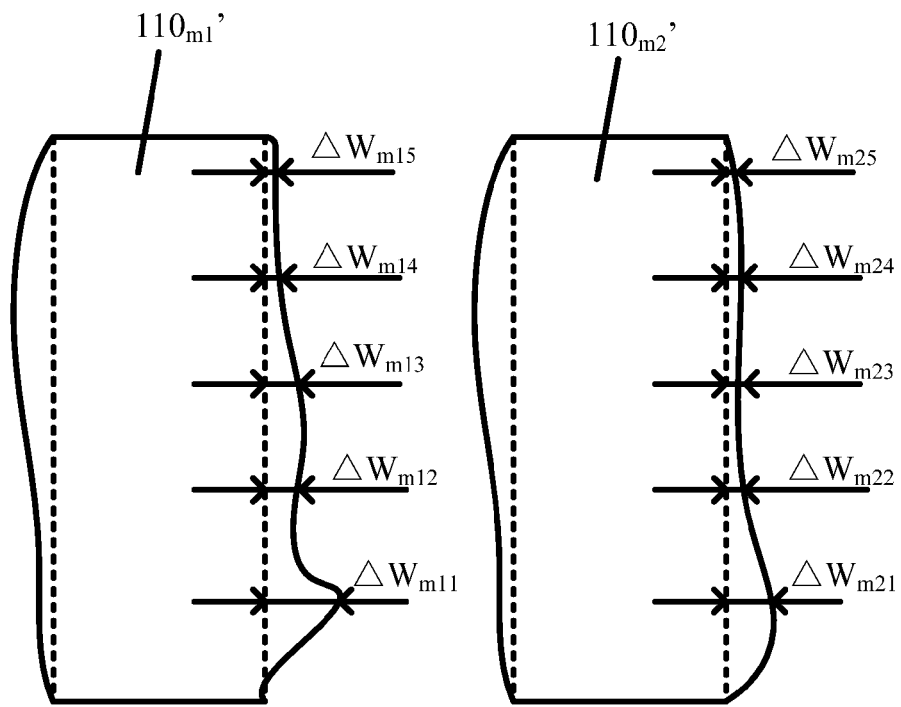

For example, the line patterns $110_{m1}$, $110_{m2}$ shown in FIG. 4 can be scanned by the SEM to obtain contour $110_{m1}'$ of line pattern $110_{m1}$ and contour $110_{m2}'$ of line pattern $110_{m2}$ as shown in FIG. 5. The contour $110_{m1}'$ of line pattern $110_{m1}$ and contour $110_{m2}'$ of line pattern $110_{m2}$ can then be sampled at a fixed sampling frequency, respectively. The roughness distribution at each sampling point of the contour $110_{m1}'$ can thereby be obtained. For example, a variation range along a second direction (which is perpendicular to the first direction) including $\Delta W_{m11}$, $\Delta W_{m12}$, $\Delta W_{m13}$, $\Delta W_{m14}$, $\Delta W_{m15}$, . . . , etc. as shown in FIG. 5 can be obtained at each sampling point of the contour $110_{m1}'$. Similarly, the roughness distribution at each sampling point of the contour $110_{m2}'$ can also be obtained, by obtaining a variation range including $\Delta W_{m21}$, $\Delta W_{m22}$, $\Delta W_{m23}$, $\Delta W_{m24}$, $\Delta W_{m25}$, . . . , etc. along the second direction (which is perpendicular to the first direction) as shown in FIG. 5. It is noted that although FIG. 5 illustrates five sampling points (corresponding to five variation ranges) on each line pattern, one of ordinary skill in the art would understand that the sampling points on each line pattern can be more than or less than five.

The sampling frequency is determined depending on the resolution of the SEM in the first direction. The sampling frequency can be equal to or less than the resolution of the SEM, for example, can be less than about ½ of the resolution of the SEM in the first direction. In practical operations, the sampling frequency can be about ½ of the resolution. In one embodiment, the resolution of the SEM can be about 4 nm, and the sampling frequency can be about 2 nm. In order to make the roughness distribution obtained from the line patterns 110 (shown in FIG. 4) closer to (better matches with) the contour of the line patterns 110, a sampling point can be selected for sampling within a length of about 1 nm to about 3 nm, i.e., a spatial period for sampling can be about 1 nm to about 3 nm. The sampling frequency is a reciprocal of the spatial period of the sampling and is about $3 \times 10^{-1}$ nm$^{-1}$ to about $10^0$ nm$^{-1}$. In one embodiment, the sampling can be performed at an interval of about 2 nm, i.e., the sampling frequency can be about $5 \times 10^{-1}$ nm$^{-1}$. The obtained roughness distribution of the line patterns 110 can be more accurate.

In one embodiment when the sampling is performed at an interval of about 2 nm, in addition to obtaining the roughness distribution at a sampling frequency of about $5 \times 10^{-1}$ nm$^{-1}$, the roughness distribution of the line patterns 110 can also be obtained at lower sampling frequencies such as about $2.5 \times 10^{-1}$ nm$^{-1}$, $1.7 \times 10^{-1}$ nm$^{-1}$, etc. In this manner, the subsequently-obtained power spectral density (PSD) curve can actually contain roughness distributions at various frequencies that are applied.

It should be noted that, the variation ranges are shown in FIG. 5 relative to the dashed flat surface. In addition, although FIG. 5 illustrates the variation ranges (along the second direction) at one side (along the first direction) of the contour $110_{m1}'$ of line pattern $110_{m1}$ and the contour $110_{m2}'$ of line pattern $110_{m2}$, one of ordinary skill in the art would understand that both sides of the contour of each line pattern 110 can be sampled to obtain the variation ranges of both sides of the contours of line pattern 110.

Based on the roughness distributions of the line patterns on each of the test samples corresponding to each sampling point, the roughness distribution of the standardized model (Golden sample) eliminating noise effects from the SEM can be obtained. The roughness distribution of the test sample can be extracted from the roughness distribution of the line patterns 110 in each test sample (shown in FIG. 4)

Figure 6:
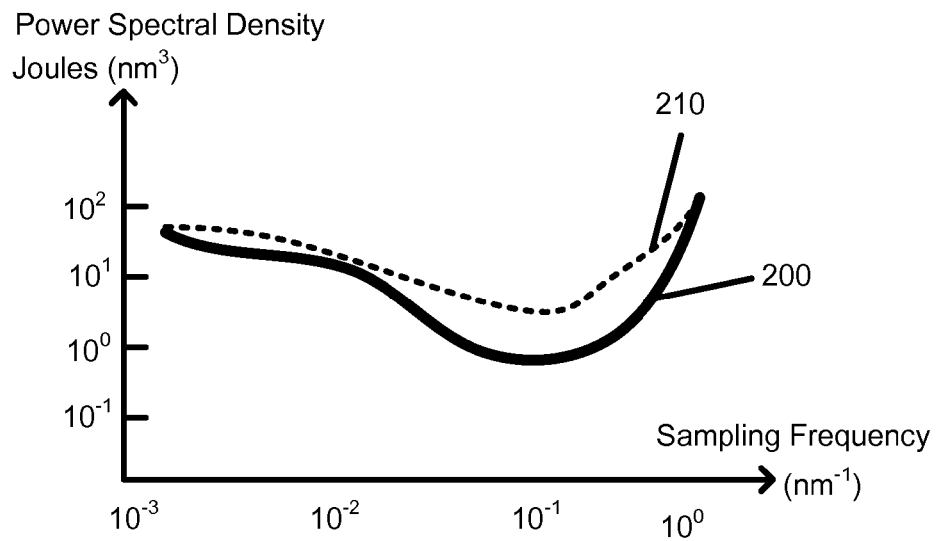

In one embodiment, a discrete series can be obtained based on the roughness distribution of the line patterns on each test sample. The discrete series can be related to the line patterns and the positions on the line patterns corresponding to $\Delta W_{m11}$, $\Delta W_{m12}$, $\Delta W_{m13}$, $\Delta W_{m14}$, $\Delta W_{m15}$, . . . , $\Delta W_{m21}$, $\Delta W_{m22}$, $\Delta W_{m23}$, $\Delta W_{m24}$, $\Delta W_{m25}$, . . . , etc. An autocorrelation function can be obtained based on the discrete series. According to the formula $PSD_{gold}=F(\zeta, (var \omega))$, via Fourier transform method, the power spectral density (PSD) curve of each test sample can be plotted (not shown). In the formula $PSD_{gold}=F(\zeta, (var \omega))$, $\zeta$ is a parameter of a corresponding length characterizing an edge roughness; $\omega$ is a variation range of the line pattern 110 in the second direction including, e.g., $\Delta W_{m11}$, $\Delta W_{m12}$, $\Delta W_{m13}$, $\Delta W_{m14}$, $\Delta W_{m15}$, . . . , $\Delta W_{m21}$, $\Delta W_{m22}$, $\Delta W_{m23}$, $\Delta W_{m24}$, $\Delta W_{m25}$, . . . , etc.; and var ($\omega$) is the square of the standard deviation of the above variation ranges. The roughness distributions at locations within the corresponding length can affect each other. Based on the roughness distribution at a certain location, the roughness distributions for other locations within the corresponding length can be obtained. The power spectral density (PSD) curves of all test samples can then be averaged. Signal-to-noise ratio can thus be improved and a power spectral density curve 200 of the standardized model (Golden PSD) can be obtained as shown in FIG. 6. In FIG. 6, the horizontal axis is the sampling frequency, and the vertical axis is the power spectral density (PSD) of the test samples.

Optionally, after the discrete series is obtained, the data at each sampling point in the discrete series can first be filtered (e.g., as an outliers pretreatment) to remove the data of the sampling points that do not match with the roughness distribution under such exposure process due to exposure process failure or other possible reasons. Thus the subsequently-obtained power spectral density (PSD) curve of the standardized model can be more accurate.

The PSD curve 200 of the standardized model in FIG. 6 can be obtained from the roughness distributions of the plurality of test samples after the above-mentioned Fourier transform method. The PSD curve 200 represents the roughness distribution on the test samples under the above exposure process, after the noise of the SEM has been eliminated. The standardized model is a sample obtained by simulation and does not change with time. In addition, the roughness distribution of the standardized model can substantially match with (e.g., close to) the roughness distribution of the actual test sample, as indicated by a dashed line 210 in FIG. 6. The standardized model can be used as a detection standard to detect the quality of the electron beam of the SEM. After the PSD curve 200 of the standardized model is obtained, each time before the quality of the electron beam in the SEM is detected, the following steps as shown in FIGS. 7-11 can be included.

Figure 7:
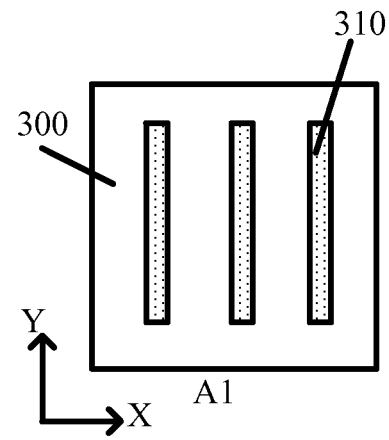

Referring to FIG. 7, a detection sample 300 is provided with line patterns 310 formed on the surface in a first direction. The exposure conditions for forming the line patterns 310 on the surface of the detection sample 300 are the same as the exposure conditions for forming line patterns 110 in the first direction on the surface of the test samples A as shown in FIG. 4.

In one embodiment, the first direction is Y-direction. When the line patterns 310 in the first direction are formed on the surface of the detection sample 300, ring-shaped light source can be used for exposure. The exposure energy can be about 25 mJ to about 50 mJ, for example.

Figure 8:
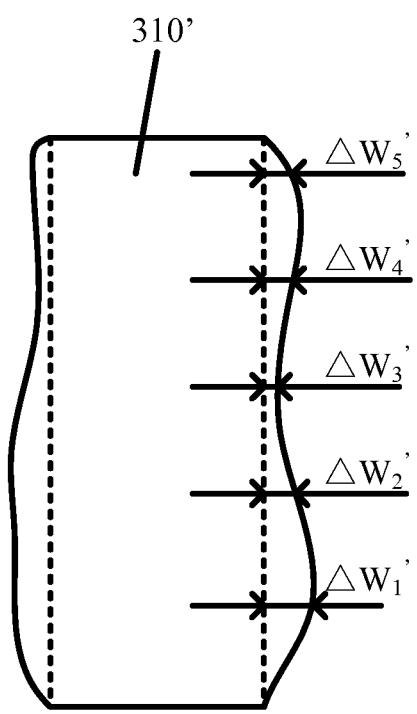

Referring to FIG. 8, contour 310' of the line pattern 310 on the surface of detection sample 300 can be obtained by SEM. Contour 310' of the line pattern 310 of detection sample 300 can be sampled at a fixed sampling frequency as described above, and the roughness distribution of the line pattern 310 of the detection sample 300 can be obtained.

Due to the effect of the noise of the SEM and the quality of the electron beam of the SEM, difference between the obtained contour 310' of the line pattern 310 and the actual contour of the line pattern 310 may occur. The exposure conditions of the line pattern 310 are the same as the exposure condition of the line pattern 110. Under the same exposure conditions, the roughness distribution of both patterns can be the same, i.e., the contours of both patterns can be the same shown as the dashed line 210 in FIG. 6. Moreover, the PSD curve of the standardized model can substantially match with the PSD curve corresponding to the contour of the actual test sample. Once the PSD curve (roughness distribution) of the detection sample are found, the PSD curve of the detection sample can be compared with the PSD curve of the standardized model (Golden PSD).

Figure 9:
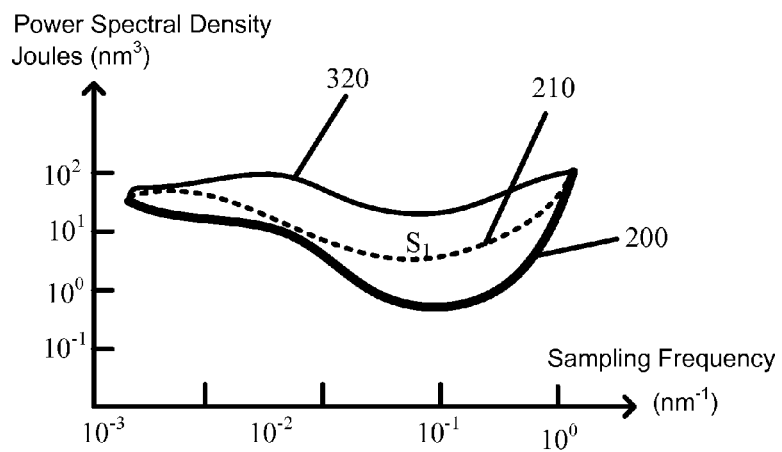

In some embodiments, to obtain a PSD curve 320 of the detection sample as shown in FIG. 9, the following steps can be performed, for example, by sampling the contour 310' at the fixed sampling frequency to obtain the variation ranges of the line pattern 310 in the second direction at each sampling point of $\Delta W_1'$, $\Delta W_2'$, $\Delta W_3'$, $\Delta W_4'$, $\Delta W_5'$, . . . in FIG. 8; obtaining a discrete series of each sampling point in the second direction according to the variation ranges $\Delta W_1'$, $\Delta W_2'$, $\Delta W_3'$, $\Delta W_4'$, $\Delta W_5'$, . . . ; and performing filtering, autocorrelation and Fourier transforming as described above to obtain the PSD curve 320 of the detection sample, as shown in FIG. 9.

In various embodiments, the method for obtaining the PSD curve 320 of the detection sample 300 can be the same or similar to the method for obtaining the PSD curve 200 of the standardized model (Golden PSD).

Still referring to FIG. 9, according to the line patterns in the standardized model and the roughness distribution obtained for the line patterns 310 of test sample 300 (shown in FIG. 7), the resolution of the electron beam from the SEM in the second direction can be determined.

In one embodiment, roughness distribution is expressed by PSD curve, and the quality of the electron beam can be determined by comparing PSD curve 320 of the detection sample with PSD curve 200 of the standardized model (Golden PSD). For example, it can be determined whether the quality of the electron beam in the second direction is desired or sufficiently high by, for example, providing a first preset area $S_0$; and computing the area $S_1$ between PSD curve 320 of the detection sample and PSD curve 200 of the standardized model (Golden PSD). The first preset area $S_0$ can be determined by, for example, an area between a tool reference PSD (not shown) and PSD curve 200 of the standardized model. Due to tool limitation, offset exists between measured PSD and the standardized model Golden PSD even at best tool condition. In one embodiment, full map line edge roughness (LER) measurement using rectangular scan mode can be carried out with sufficient sampling to suppress statistical noise. Similar data processes can be performed to obtain the tool reference PSD respectively from X-direction and Y-direction LER measurements.

That the area S1 is larger than the first preset area $S_0$ may indicate unsatisfied (or unqualified) quality of the electron beam in the SEM. This may cause large errors in subsequent measurements of the dimensions of fine patterns in X direction (as shown in FIG. 4), and the SEM (e.g., the e-beam of the SEM) needs to be re-adjusted. After this re-adjustment, the line pattern 310 of the detection sample 300 can be detected using the disclosed methods until the area $S_1$ is less than or equal to the preset area $S_0$ and the quality of the electron beam of the SEM in X-direction is qualified.

In other embodiments, in addition to plotting the PSD curves, the disclosed methods can further include obtaining the contour of the line patterns of the standardized model and the contour of the line patterns of the detection sample; and then comparing the area there-between.

When the electron beam emitted to the surface of each sample, the dimension accuracy of fine patterns obtained by the SEM can be desired when the electron beam spot is circular with small diameter. Therefore, to determine the quality of the electron beam in the SEM, in addition to determining the resolution of the electron beam along the second direction, the resolution of the electron beam in the first direction may also be determined.

Figure 10:
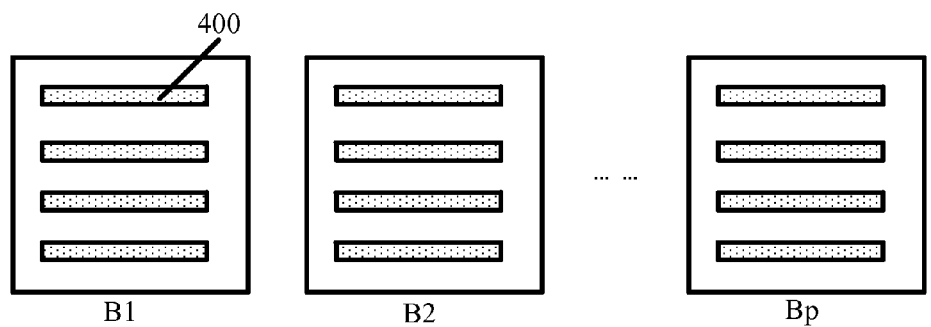

Referring to FIG. 10, another set of test samples are provided. A number p of the test samples can include B1, B2, . . . , and Bp. On the surface of each test sample in the set, there can be a number q of line patterns 400 formed along a second direction (e.g., in X-direction). Thus there can be a total of (p×q) line patterns in the second direction in this set of test samples as shown in FIG. 10.

Figure 2:
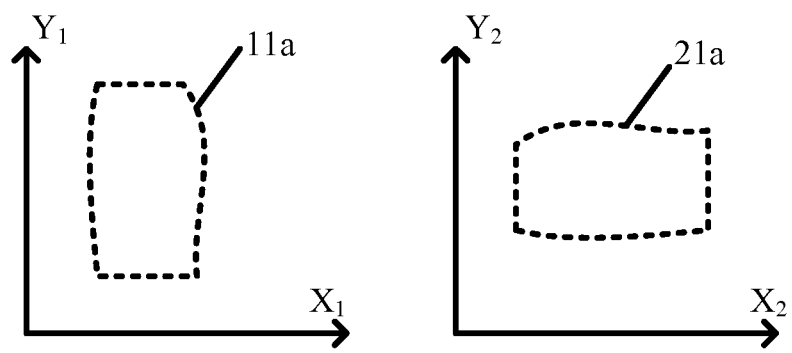
Figure 3:
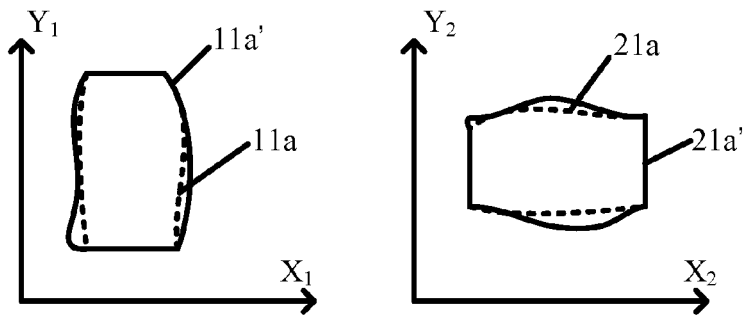
Figure 11:
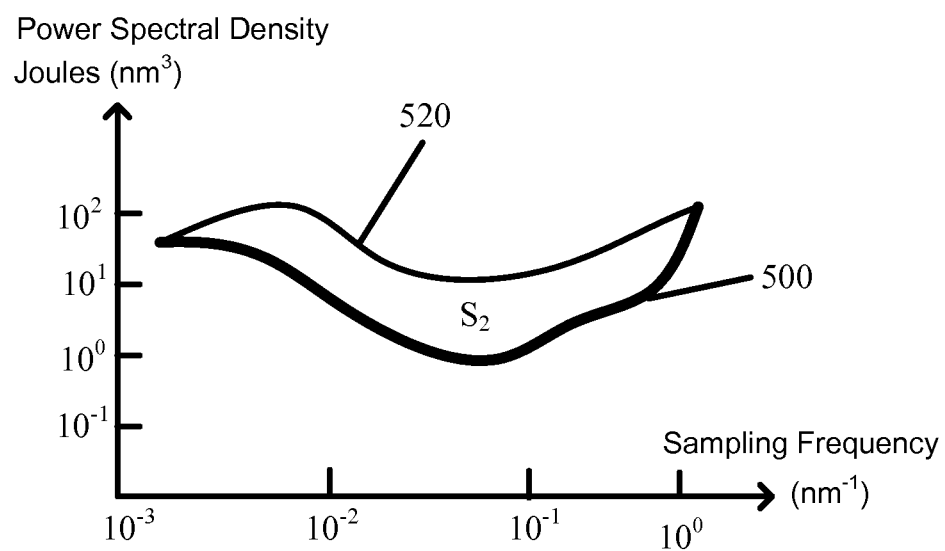

The set of test samples can be used to obtain a PSD curve 500 of the standardized model in the first direction as shown in FIG. 11, in order to facilitate the subsequent detection of the resolution of the electron beam in the first direction. The method for obtaining the PSD curve 500 of the standardized model from the set of test samples can be the same as for obtaining the PSD curve 200 as depicted in FIGS. 2 and 9.

When the PSD curve 500 is obtained from the set of test samples in FIG. 10, another detection sample can be provided (not shown). Under the same exposure conditions, line patterns in the second direction can be formed on the surface of the detection sample and a PSD curve 520 of the detection sample can be obtained as shown in FIG. 11). An area $S_2$ between the PSD curve 500 of the standardized model of the set of test samples and the PSD curve 520 of the detection sample is compared with a second preset area $S_0'$. The area difference between $S_2$ and $S_0'$ can be determined. The resolution of the electron beam in the first direction can then be determined as referring to previous descriptions of determining the resolution of the electron beam in the second direction.

In some embodiments, to save processing steps, the line patterns in the first direction and the line patterns in the second direction can be formed on a same detection sample. When the resolution of the electron beams in both the first direction and the second direction meets the requirements, the quality of the electron beam is satisfied. Otherwise the SEM needs to be re-adjusted. When fine patterns are detected using the electron beam of high quality, errors caused by the electron beam quality can be significantly reduced, and accuracy of detected fine patterns can be high.

In this manner, because the line patterns of both the detection sample and the standardized model are formed under the same exposure process, the variation ranges (and/or roughness) thereof in the second direction are the same. Comparing their PSD curves can determine whether the quality of the electron beam is sufficiently high in the second direction to improve the detecting accuracy of fine patterns.

Further, the PSD curve of the standardized model can be obtained by averaging the PSD curves of a plurality of test samples. And the exposure process for forming the line patterns in the first direction on the test samples is the same as the exposure process for forming the line patterns in the first direction on the detection sample. The PSD curve obtained for the standardized model has effectively excluded the effect of noise from the SEM (e.g., the quality of the electron beam), thereby having high accuracy.

Furthermore, various embodiments also include, for example, determining whether the quality of the electron beam in the first direction is sufficiently high, and obtaining the quality of the electron beam that is sufficiently high in both the first direction and the second direction. The electron beam has reliable quality, and the cross-sectional area of the electron beam is circular with small radius.

The electronic beam, when detected to be sufficiently high by the disclosed detection method, has better quality. When the electron beam of better quality is subsequently used for detecting fine patterns, the obtained dimensions can be more accurate.

The disclosed methods can quantitatively monitor CD-SEM e-beam condition (both focus and astigmatism) with high consistency and sensitivity taking advantages of ADI line edge roughness (LER) measurements. By these method, subjective judgment on CD-SEM beam condition can be avoid to timely eliminate risk of inaccurate inline measurement. Requirements for traditional resolution sample such as feature size, feature uniformity and isotropy, robustness against charging and contamination, etc. can be bypassed. The standardized model can avoid effect from individual wafers and become a 'Golden' standard.

Power spectral density (PSD) as a numerical treatment can be effective in extracting the model parameter and, on the other hand, can be sensitive to CD-SEM conditions. The disclosed methods can amplify the subtle yet solid connection between CD-SEM condition and ADI (i.e., after-develop inspection) LER information to a certain level that it useable as a benchmark of SEM monitoring system.

In one embodiment, a set of stable baseline lithographic conditions can be selected including, but not limited to, illumination mode, photoresist (PR) selection, PR coating recipe, variable baking condition, etc. This baseline lithographic conditions can provide symmetric performance on X and Y axis. For example: dipole illumination mode may not be used for introducing anisotropy in X and Y performance.

In various embodiments, a mask layout used in an exposure process can include single type of dense feature along X and Y axis with pitch that provides lowest MEEF (i.e., mask error enhancement factor) and OPC (i.e., optical proximity correction) correction. For example, anchor point dense pattern can be used herein.

In various embodiments, daily monitor ADI wafer can be used for repetitive usage. Any concern regarding sample contamination, charging, feature anisotropy can intrinsically bypassed according to the disclosed methods. Once a reasonable threshold is set, individual human influence is also eliminated as a whole.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for detecting an electron beam of a SEM, comprising:
    providing a detection sample including a plurality of line patterns formed thereon, wherein the plurality of line patterns has a length in a first direction;
    obtaining a power spectral density (PSD) curve of a standardized model, wherein the standardized model and the detection sample are formed under a same exposure process;
    obtaining an edge contour of each of the plurality of line patterns of the detection sample by the SEM;
    sampling the edge contour of each of the plurality of line patterns of the detection sample at a sampling frequency to obtain a variation range at a sampling point on the edge contour in a second direction, the second direction being perpendicular to the first direction;
    obtaining a PSD curve of the detection sample according to the variation range; and
    comparing the PSD curve of the detection sample and the PSD curve of the standardized model to calculate an area between the PSD curve of the detection sample and the PSD curve of the standardized model;
    determining that the electron beam of the SEM has a high quality in the second direction when the area is smaller than or equal to a first preset area, wherein the first preset area is an area between a tool reference PSD curve for the same exposure process and the PSD curve of the standardized model.

2. The method of claim 1, wherein the obtaining of the PSD curve of the standardized model includes:
    providing a plurality of test samples, each test sample having a plurality of line patterns formed thereon in the first direction, wherein the plurality of line patterns are formed on each test sample using the same exposure process for forming the plurality of line patterns on the detection sample in the first direction;
    obtaining a test edge contour of each of the plurality of line patterns on each test sample using the SEM;
    sampling a dimension of the test edge contour of each of the plurality of line patterns on each test sample at the sampling frequency to obtain a test variation range;
    obtaining a test PSD curve of each of the plurality of test samples according to the test variation range at a test sampling point on the test edge contour in the second direction; and
    averaging the test PSD curve of each of the plurality of test samples.

3. The method of claim 2, wherein the sampling frequency is less than or equal to ½ of a resolution of the SEM in the first direction.

4. The method of claim 2, wherein the sampling frequency ranges from about $3 \times 10^{-1}$ $nm^{-1}$ to about $10^0$ $nm^{-1}$.

5. The method of claim 1, wherein the obtaining of the PSD curve of the detection sample according to the variation range includes:
    obtaining a discrete series of the variation range and the sampling frequency;

obtaining an autocorrelation function according to the discrete series; and plotting the PSD curve of the detection sample using Fourier transform method and a model function PSD=F($\zeta$, var($\omega$)), wherein $\zeta$ is a parameter of a corresponding length for characterizing an edge roughness, $\omega$ is the variation range of a line pattern on the detection sample in the second direction, and var ($\omega$) is square of standard deviation of the variation range.

6. The method of claim 2, wherein the obtaining of the PSD curve of the detection sample according to the variation range includes:

obtaining a discrete series of the variation range and the sampling frequency;

obtaining an autocorrelation function according to the discrete series; and plotting the PSD curve of the detection sample using Fourier transform method and a model function PSD=F($\zeta$, var($\omega$)), wherein $\zeta$ is a parameter of a corresponding length for characterizing an edge roughness, $\omega$ is the variation range of a line pattern on the detection sample in the second direction, and var ($\omega$) is square of standard deviation of the variation range.

7. The method of claim 1, further including:

re-adjusting the electron beam of the SEM, when the electron beam of the SEM does not have the high quality in the second direction, until the area is smaller than or equal to the first preset area.

8. The method of claim 1, further including:

determining whether the electron beam of the SEM has the high quality in the first direction.

9. A method for detecting a fine pattern, comprising:

providing a detection sample including a plurality of line patterns formed thereon, wherein the plurality of line patterns has a length in a first direction;

obtaining a power spectral density (PSD) curve of a standardized model, wherein the standardized model and the detection sample are formed under a same exposure process;

obtaining an edge contour of each of the plurality of line patterns of the detection sample by the SEM;

sampling the edge contour of each of the plurality of line patterns of the detection sample at a sampling frequency to obtain a variation range at a sampling point on the edge contour in a second direction, the second direction being perpendicular to the first direction;

obtaining a PSD curve of the detection sample according to the variation range;

comparing the PSD curve of the detection sample and the PSD curve of the standardized model to determine whether an electron beam of the SEM has a high quality in the second direction; and detecting a sample having a plurality of fine patterns to be detected using the electron beam that has been determined as having the high quality in the second direction.

10. The method of claim 9, wherein the obtaining of the PSD curve of the standardized model includes:

providing a plurality of test samples, each test sample having a plurality of line patterns formed thereon in the first direction, wherein the plurality of line patterns are formed on each test sample using the same exposure process for forming the plurality of line patterns on the detection sample in the first direction;

obtaining a test edge contour of each of the plurality of line patterns on each test sample using the SEM;

sampling a dimension of the test edge contour of each of the plurality of the line patterns on each test sample at the sampling frequency to obtain a test variation range;

obtaining a test PSD curve of each of the plurality of test samples according to the test variation range at a test sampling point on the test edge contour in the second direction; and averaging the test PSD curve of each of the plurality of test samples.

11. The method of claim 10, wherein the sampling frequency is less than or equal to ½ of a resolution of the SEM in the first direction.

12. The method of claim 10, wherein the sampling frequency ranges from about $3\times10^{-1}$ nm$^{-1}$ to about $10^0$ nm$^{-1}$.

13. The method of claim 9, wherein the obtaining of the PSD curve of the detection sample according to the variation range includes:

obtaining a discrete series of the variation range and the sampling frequency;

obtaining an autocorrelation function according to the discrete series; and plotting the PSD curve of the detection sample using Fourier transform method and a model function PSD=F($\zeta$, var($\omega$)), wherein $\zeta$ is a parameter of a corresponding length for characterizing an edge roughness, $\omega$ is the variation range of a line pattern on the detection sample in the second direction, and var ($\omega$) is square of standard deviation of the variation range.

14. The method of claim 10, wherein the obtaining of the PSD curve of the detection sample according to the variation range includes:

obtaining a discrete series of the variation range and the sampling frequency;

obtaining an autocorrelation function according to the discrete series; and plotting a PSD curve of the detection sample using Fourier transform method and a model function PSD=F($\zeta$, var ($\omega$)), wherein $\zeta$ is a parameter of a corresponding length for characterizing an edge roughness, $\omega$ is the variation range of a line pattern on the detection sample in the second direction, and var ($\omega$) is square of standard deviation of the variation range.

15. The method of claim 9, further including:

re-adjusting the electron beam of the SEM, when the electron beam of the SEM does not have the high quality in the second direction, until the area is smaller than or equal to the first preset area.

16. The method of claim 9, further including:

determining whether the electron beam of the SEM has the same high quality as in the first direction.

\* \* \* \* \*